US00RE36608E

United States Patent [19]

Smith et al.

[11] E Patent Number: Re. 36,608

[45] Reissued Date of Patent: Mar. 14, 2000

[54] MOVABLE REGISTRATION PIN MECHANISM

[75] Inventors: W. Vernon Smith, Tustin; Hendley W. Hall, San Pedro, both of Calif.

[73] Assignee: Excellon Automation Co, Torrance, Calif.

[21] Appl. No.: 08/855,884

[22] Filed: May 12, 1997

Related U.S. Patent Documents

Reissue of:

[64] Patent No.: 5,479,722
Issued: Jan. 2, 1996
Appl. No.: 08/294,967
Filed: Aug. 24, 1994

[51] Int. Cl.[7] ..... B23Q 3/00; B25B 11/00

[52] U.S. Cl. ..... 33/617; 33/623; 33/568

[58] Field of Search ..... 33/617, 614, 619, 33/621, 622, 623, 645, 568, 573; 101/481, DIG. 36

[56] References Cited

U.S. PATENT DOCUMENTS 3,626,600 12/1971 Gaither ..... 33/568
4,805,316 2/1989 Curti ..... 33/623
4,977,683 12/1990 Harder ..... 33/623
5,255,607 10/1993 Nishiyama et al. ..... 33/617

*Primary Examiner*—Christopher W. Fulton
*Attorney, Agent, or Firm*—Henry G. Kohlmann

[57] ABSTRACT

Apparatus for providing a movable upright registration pin extending above a horizontal work surface for locating workpieces on the tooling plate of a computer controlled drilling machine. A straight edge member, disposed in a channel in the surface of the tooling plate, provides two vertical reference surfaces which are precisely located to define a line of position for the registration pin. The registration pin is maintained upright in a carrier that is slidably disposed in a channel in the straight edge member between the two reference surfaces. The rotation of a cam bar disposed adjacent the carrier applies force to the carrier which causes the registration pin to bear against the two vertical reference surfaces to precisely and securely locate the pin on the line of position. The registration pin may be pushed by the spindle of the drilling machine along the line of position and then locked in the registration position under the automatic control of the drilling machine. In a first embodiment, the height of the registration pin is fixed with respect to the surface of the tooling plate of the drilling machine. In a second embodiment, the spindle of the drilling machine may be used to automatically adjust the height of the registration pin above the tooling plate.

44 Claims, 3 Drawing Sheets

MOVABLE REGISTRATION PIN MECHANISM

Matter enclosed in heavy brackets [ ] appears in the original patent but forms no part of this reissue specification; matter printed in italics indicates the additions made by reissue.

BACKGROUND

1. Field of Invention

This invention relates, in general, to an apparatus for registering workpieces on a computer controlled drilling machine and, in particular, to registration apparatus which allows a drilling machine to automatically position registration pins to accommodate workpieces of various sizes. The invention relates especially to a registration pin mechanism wherein the registration pin may be precisely positioned along a line of position under the control of the drilling machine.

2. Prior Art

The drilling operations performed in conjunction with manufacturing printed circuit boards or panels are required to be performed to very precise tolerances. The drilled holes are commonly of a diameter of 0.0018 of an inch or less and typically must be positioned within a tolerance of 0.00017 inches or less. These drilling operations are performed with a computer controlled drilling machine under automatic numerical control and may typically involve thousands of drilling operations per panel. The printed circuit board panels are placed on a horizontal work platform or tooling plate located below the drill spindle. The panels are typically stacked up to three or four high on the tooling plate of the drilling machine so that several panels are drilled at the same time. Often drilling machines have several spindles so that there may be several stacks of panels drilled on the same machine. Since the spindle must be able to reach any point on the panels, relative movement in three dimensions is required between the spindle and the panels. This requirement has been implemented in various ways. In a common drilling machine design, the tooling plate moves in one horizontal dimension and the drill spindle moves in the orthogonal horizontal dimension and also in the vertical dimension.

In order for the numerically controlled drilling machine to hole the required drill pattern in a panel, the panel must be registered to the coordinate system of the drilling machine. A common method of registration is to position the center of the panel in the same place on the tooling plate of the drilling machine regardless of the size of the panel. Under this registration system, the panels are provided with four slots that fit over four upright pins disposed on the tooling plate of the drilling machine. A first pair of slots is located on a first centerline of the panel, usually near the opposing edges of the panel with the longer axis of each slot located on the centerline. The second pair of slots is located on the centerline orthogonal to the first centerline near the other opposing edges of the panel, again with the longer axes of the slots located on the orthogonal centerline. The corresponding upright pins on the tooling plate are located to position the center of the panel at the prescribed location in the coordinate system of the drilling machine. Under this registration system, the two slots positioned on the same center line and the associated registration pins, contain the position of the panel in the dimension orthogonal to the centerline upon which they are disposed. Correspondingly, the other two slots and associated registration pins position the panel in the other dimension. Accordingly when the panel is placed over this set of four pins, its position is determined with respect to the coordinate system of the drill.

For many years the panels have been hand loaded onto the tooling plate of the drilling machine. Because the registration pins were required be located in numerous places on the tooling plate to accommodate different size workpieces and different registration systems, the tooling plate was provided with removable plugs in the general area where the registration pins were to be located. The drilling machine itself was then used to drill precisely positioned registration holes in the plugs and the registration pins were manually inserted in the holes. When a panel that required a different location of the registration pins was to be drilled, the registration pins were manually repositioned to new holes in the removable plugs which were appropriately located for the dimensions and design of the new panel. This approach is very accurate because it uses the coordinate system of the drilling machine to drill the new registration holes in the appropriate locations, but it is time consuming, requires the drilling of new holes for the registration pins and the manual insertion of the pins, and often requires a complete setup operation including installing new plugs.

Another method has been to install registration pins permanently in a single registration pattern on the tooling plate and require that the panels be separately registered on carriers which would then be placed on the drilling machine. This requires a new carrier for each size of panel. Furthermore, because two registrations are in fact required—one for the carrier on the tooling plate and one for the printed circuit board panel on the carrier—two sets of potential registration errors are also produced.

Recent trends in flexible manufacturing have created a need to reduce the time and operator demands of the registration process. Also batch sizes have been getting smaller and are predicted to get still smaller in the future. Consequently, a manufacturer is required to be flexible enough to handle these small batch sizes and the resulting frequent setup operations. The necessity to accommodate workpieces of various sizes and various locations of the registration pins has required that the pins be positionable precisely over a continuous range of possible locations. And finally, with the advent of apparatus for automatically loading the panels on the drilling machine, the registration process is the only remaining operator intensive function in the computer controlled drilling process.

SUMMARY OF THE INVENTION

It is therefore an object of the present invention to provide automatic positioning of registration pins in a computer controlled drilling machine.

Another object of the present invention is to use the precise control of the drilling machine to position registration pins.

A further object is to provide a movable registration pin that may be securely positioned in a precise registration position.

Another object is to provide a registration pin that is movable along a line of position and may be precisely and securely located along that line of position.

Still another object is to provide a movable registration pin in which the height of the registration pin above the tooling platform may be adjusted under the control of the drilling machine.

Yet another object is to provide a movable registration pin mechanism that may be incorporated in the tooling platform of a drilling machine.

Another object is to provide a movable registration pin mechanism that is simple and reliable.

Briefly, these and other objects are provided in the present invention in which a straight edge member is disposed in a channel in the surface of a tooling plate. The straight edge member provides two vertical reference surfaces which are precisely located to define a line of position for a registration pin. The registration pin is maintained upright in a carrier that is slidably disposed in the straight edge member and allows the registration pin to be pushed by the spindle of the drilling machine along the line of position under the automatic control of drilling machine. The rotation of a cam bar under the control of the drilling machine applies force to the carrier which causes the registration pin to bear against the two vertical reference surfaces to precisely and securely locate the pin on the line of position. In a first embodiment, the height of the registration pin is fixed with respect to the surface of the tooling plate of the drilling machine. In a second embodiment, the spindle of the drilling machine may be used to automatically adjust the height of the registration pin above the tooling plate.

Other advantages, and features of the present invention will become apparent from the following detailed description of the preferred embodiment of the invention when considered in conjunction with the accompanying drawings, wherein like reference characters represent like parts throughout the several views.

DESCRIPTION OF THE PREFERRED EMBODIMENTS

Figure 1:
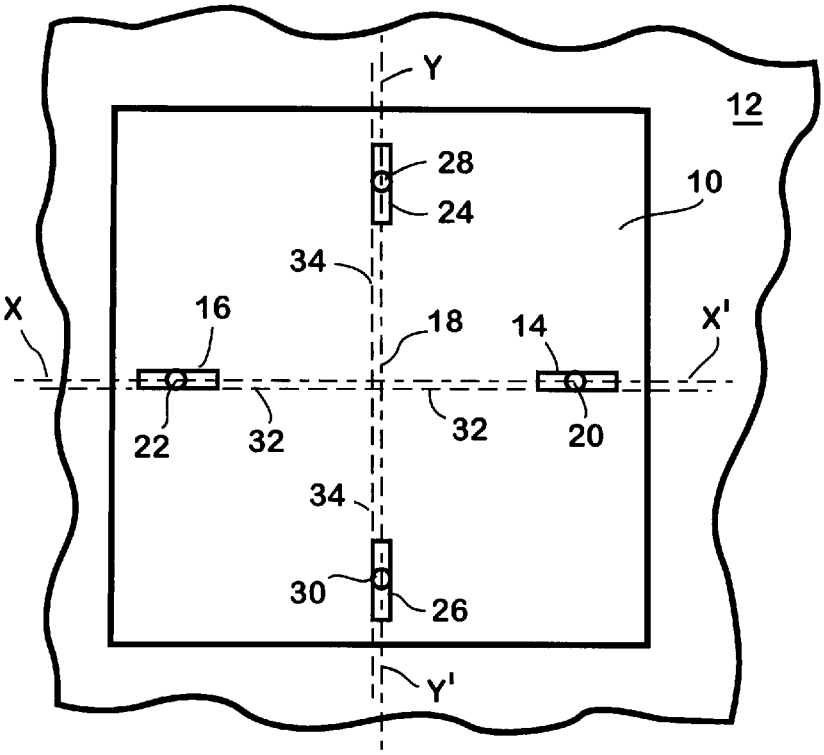
(PRIOR ART) Figure 1
FIG. 1 is a schematic diagram illustrating a conventional registration concept useful in understanding the setting of the present invention and with which the present invention is particularly useful.

Referring now to the drawings, and in particular to FIG. 1, a printed circuit board panel 10 is shown disposed on the tooling plate 12 of a drilling machine. The rectilinear panel 10 has two slots 14 and 16 disposed on a first centerline x—x' through the center 18 of the panel. The slots 14 and 16 are located near the opposing edges of the panel 10 on each side of the center 18 with the longer axis of each slot being precisely located on the centerline x—x'. The shorter dimension (i.e. the width) of the slots 14 and 16 is fabricated to a very close tolerance so that the slots 14 and 16 receive, in very close fit, the upright registration pins 20 and 22, respectively which are fixed in a correspondingly precise location in the tooling plate 12. The two pins 20 and 22 in the tooling plate and the two corresponding slots 14 and 16 in the printed circuit board panel 10 position the panel in one dimension, viz., the dimension normal to the centerline x—x' on which the slots 14 and 16 are located. Conveniently, the pins 20 and 22 may be located on a line parallel to the X-axis of the drilling machine and the center 18 of the panel 10 may be positioned at a known point with respect to the origin of the coordinate system of the drilling machine.

The panel 10 additionally has two slots 24 and 26 disposed on a second centerline y—y' which is normal to centerline x—x'. As is the case with slots 14 and 16, the slots 24 and 26 are located near the opposing edges of the panel 10 on each side of the center 18 with the longer axis of each slot being precisely located on the on the centerline y—y'. The width of the slots is fabricated lo a very close tolerance to receive upright registration pins 28 and 30, respectively, which are fixed in a correspondingly precise location in the tooling plate 12. The two pins 28 and 30 in the tooling plate 12 and the two corresponding slots 24 and 26 in the printed circuit board panel 10 position the panel in one dimension, viz., the dimension normal to the centerline y—y' on which the slots 24 and 26 are located. Conveniently, the pins 28 and 30 may located on the Y-axis of the drilling machine.

When the printed circuit board panel 10 is placed over this set of four pins 20, 22, 28 and 30 it is registered with respect to the coordinate system of the drilling machine because the panel is precisely positioned on the pins and the locations of the pins are known to the drilling machine. As long as a pin is in the corresponding slot, its location along the slot is not critical to the location of the panel because the pin and slot combination register the panel with respect to the direction orthogonal to the direction of the slot. Under this registration system, the center of a work-piece is positioned at the same location in the coordinate system of the drilling machine regardless of the size of the workpiece. Thus in order to register circuit board panels of various sizes, the pins may be positioned on the orthogonal X and Y centerlines of the tooling plate 12 and need only move or be positioned along these centerlines.

The registration position of the pins 20 and 22 with respect to the centerline x—x' (and thus the X-axis of the coordinate system of the drilling machine) is also defined by a "line of position" 32 which describes the location of the lower edge (as shown in FIG. 1) of pins 20 and 22. Similarly, the position of pins 28 and 30 with respect to the centerline y—y, (and thus the Y-axis of the drilling machine) is defined by a "line of position" 34 which describes the location of the left edge of pins 28 and 30. It will be recognized that the location of the registration pins may also be defined by parallel lines of position on the opposite sides of the pins.

Figure 2:
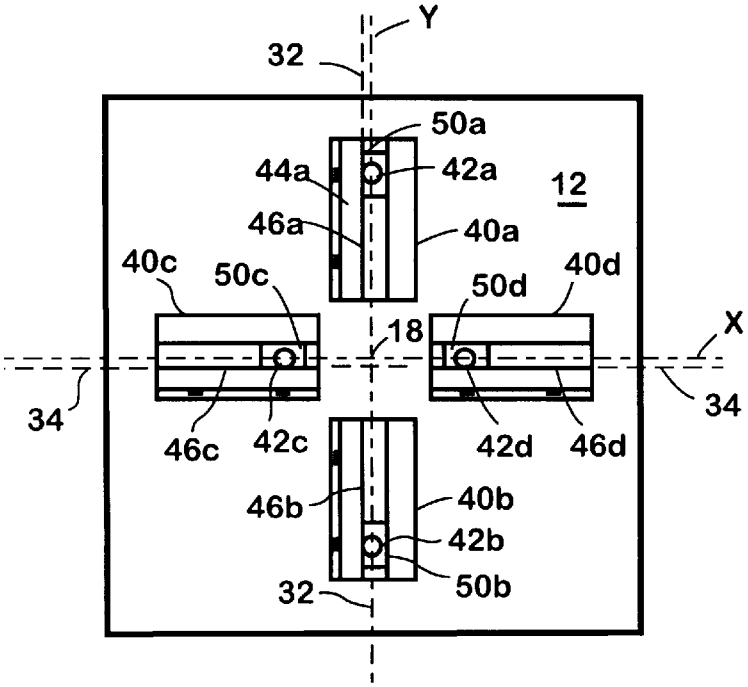
FIG. 2 is a plan view of a tooling plate illustrating movable registration pin mechanisms according to the present invention installed for implementing the registration system of FIG. 1.

Referring now to FIG. 2, the present invention provides a registration pin mechanism in which a registration pin is precisely positioned with respect to such a line of position and is movable along such a line of position under the control of the drilling machine. FIG. 2 shows a tooling plate 12 having movable registration pin mechanisms 40a and 40b, located above and below (as shown in FIG. 2) the center 18 of the tooling plate 12, respectively, for positioning registration pins 42a and 42b along line of position 32. Movable registration pin mechanisms 40c and 40d are similarly provided for positioning registration pins 42c and 42d, respectively, along line of position 34 to the left and right (as shown in FIG. 2) of the center of the tooling plate 18.

Figure 3:
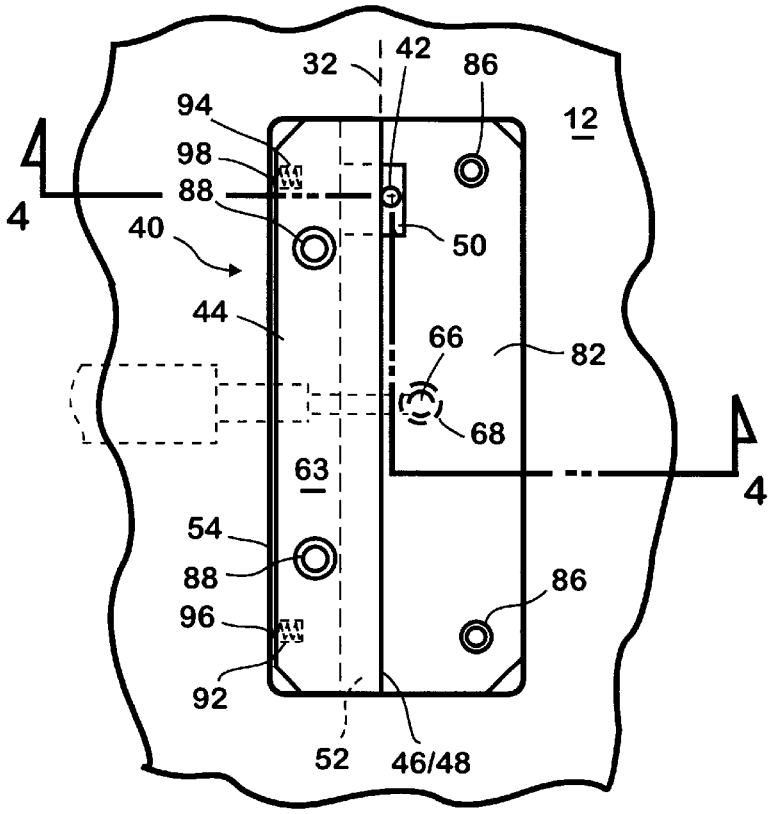
FIG. 3 is a plan view of a first preferred embodiment of a movable registration pin mechanism according to the present invention.
Figure 4:
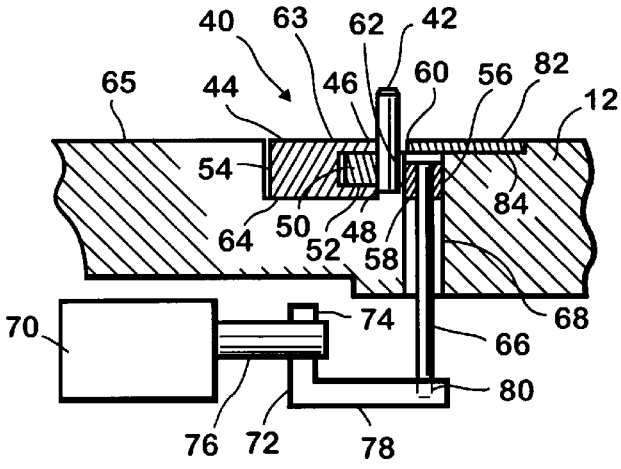
FIG. 4 is a sectional view taken along line 4—4' in FIG. 3.

Referring now to FIGS. 3 and 4, there are shown enlarged views of the embodiment of the removable registration pin mechanism 40 having a movable registration pin 42 according to the present invention. Although the orientation of the views of FIGS. 3 and 4 corresponds to the movable registration pin mechanism 40a of FIG. 2, the suffix "a" will not be used with the illustration of FIGS. 3 and 4 to avoid unnecessarily complicating the description. Accordingly, the mechanism 40 includes a hardened steel straight edge member 44 which provides precise straight vertical reference surfaces 46 and 48 against which the registration pin 42 bears to establish the exact line of position 32 for the registration pin with respect to the X-axis of the coordinate system. As best shown in the sectional drawing of FIG. 4, the registration pin 42 is fixed in a carrier 50 of rectangular cross section which holds the pin upright when the carrier 50 is slidably disposed in a right-facing longitudinal channel 52, also of rectangular cross-section, in the straight edge member 44. The pin 42 is disposed in the carrier 50 so that the carrier may not extend completely into the longitudinal channel 52. This arrangement provides clearance 54 behind the carrier 50 to allow the side of pin 42 to bear against the right-facing reference surfaces 46 and 48 of the straight edge member 44.

A cam bar 56 of square cross section is disposed facing the longitudinal channel 52 in the straight edge member 44 and extends the length of the straight edge member. The left facing surface of the cam bar 56, which has beveled edges 58 and 60, abuts the right facing surface 62 of the carrier 50 to allow the cam bar 56 when it is rotated to bear against the carrier 50.

The straight edge member 44 (with the carrier 50 holding the pin 42 disposed in the longitudinal channel 52) and the square cam bar 56 are disposed in a channel 64 in the surface of the tooling plate 12. The top surface 63 of the straight edge 44 is flush with the surface 65 of the tooling plate 12. The registration pin 42 extends a sufficient distance above the surface of the tooling plate 12 in order to allow a number of panels 10 (see FIG. 1) to be mounted on the pin.

The cam bar 56 is coupled through its longitudinal center to a cylindrical lever 66 which extends downward through a cylindrical bore 68 in the tooling plate 12. A solenoid actuated pneumatic cylinder 70, mounted under the tooling plate 12 as is conventional in drilling machines of this type, is disposed to selectively urge the lever 66 in a direction transverse to the longitudinal direction of the cam 56 via a push angle member 72. The push angle member 72 has a vertical section 74 attached to the actuating rod 76 of the pneumatic cylinder 70 and a horizontal section 78 having an aperture 80 for receiving the bottom of the lever 66. When actuation of the cylinder 70 causes the horizontal section 78 of the push angle member 72 to bear against the lever 66, cam bar 56 tends to rotate slightly around the longitudinal axis thereof between the right end surface of the channel 64 and the right facing surface of carrier 50 causing the cam bar 56 to bear against the carrier 50. The beveled edges and 16 accommodate the rotation of cam bar 56. When the cam 56 bears against the carrier 50, the side of the registration pin 42 is forced against the reference surfaces 46 and 48 of the straight edge 44 and locked in place.

A removable cover plate 82, which is disposed in a shallow channel 84 located in the upper surface of plate 12 adjacent channel 64, is flush with the surface of the tooling plate 12. The cover plate 82 retains the straight edge member 44, the carrier 50 and the cam bar in place in the channel 64. Removal of the cover plate 82 allows the mechanism to be disassembled for cleaning or repair. The removable cover 82 has two counter 5 bore holes 86 for receiving screws (not shown) to secure the cover in place in channel 84. The tooling plate 12 is provided with suitably threaded bores (also not shown) for receiving the screws for securing the cover plate 82 in place. In the foregoing arrangement, the registration pin 42 is maintained upright with the reference surfaces 46 and 48 establishing a line of position along which the registration pin may be moved.

The straight edge member 44 is provided with two spaced counterbore holes 88 for receiving screws to secure the straight edge member in place in the channel 64 of the tooling plate 12 (in suitably threaded bores—not shown) and also with short transverse bores 92 and 94 at its right edge near the opposite ends containing helical springs 96 and 98. These transverse bores, the helical springs 96 and 98 and the two counterbore holes 88 are employed in conjunction with a preferred method of aligning and securing the straight edge member to the exact line of position 32. This preferred method of alignment will be described hereinafter in connection with FIG. 7.

It will be recognized that in the first embodiment of FIGS. 3 and 4, the registration pin 42 is fixed in the carrier 50 and therefore is not movable in the vertical direction.

Figure 5:
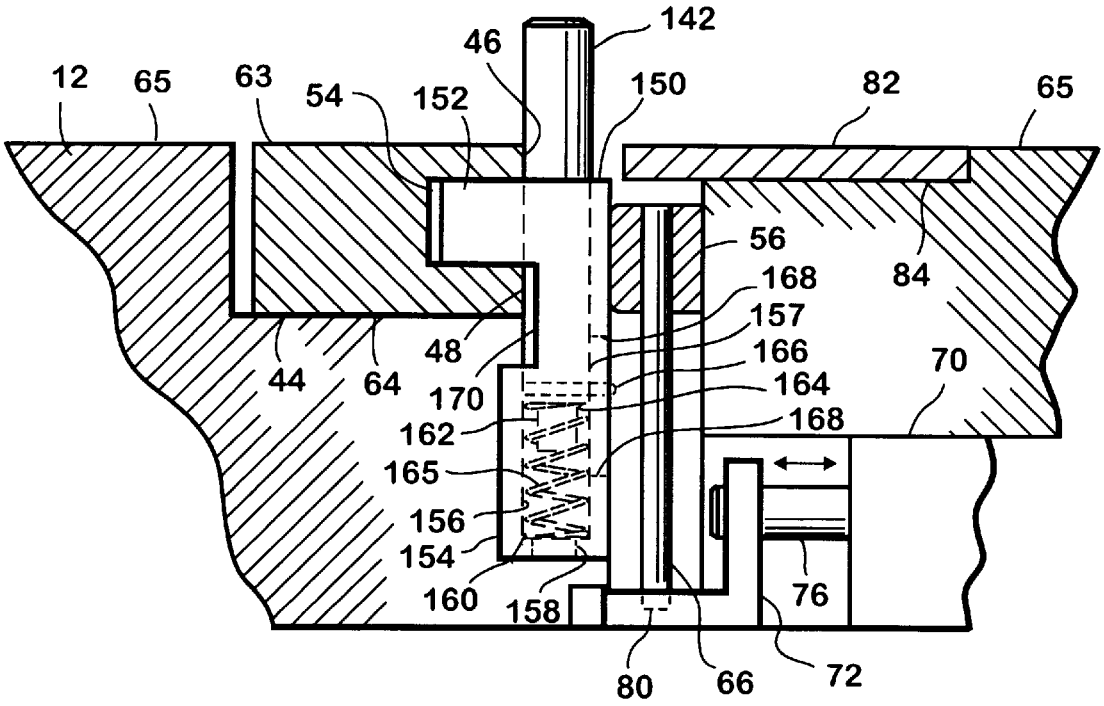
FIG. 5 is a sectional view of a second preferred embodiment of a movable registration pin mechanism taken along line 4—4' in FIG. 3.
Figure 6:
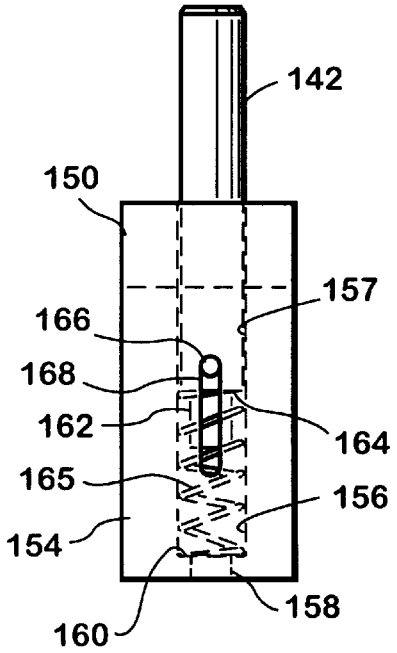
FIG. 6 is a rear plan view of the carrier 150 and a height adjustable registration pin.

Referring now to FIGS. 5 and 6 there is illustrated a second embodiment in which the registration pin 142 is movable along the line of position under the control of the drilling machine and is also movable under the control of the drilling machine in the vertical direction to adjust the height of the pin above the tooling plate 12. This allows the pin 142 to be adjusted as desired according to the height of the workpieces mounted on the tooling plate 12.

The movable registration pin mechanism of FIGS. 5 and 6 with adjustable height is similar to the embodiment of FIGS. 3 and 4 except for the design of the pin 142, the carrier 150 and the adaptation of the channel in the tooling plate to allow for the modified pin and carrier. Referring now to FIGS. 5 and 6, the carrier 150 is an L-shaped member having a first rectangular section 152 similar to the carrier 50 and adapted to be slidably disposed in the channel 52 in the straight edge member 44. The carrier 150 further has a section 154 at a right angle with section 152. Section 154 extends downward into a longitudinal channel 156 of rectangular cross section in the tooling plate 12. The channel 156, which extends longitudinally below the straight edge member 44 and the first horizontal section 152 of the of the carrier 150, is adapted to receive section 154 of the carrier.

The carrier 150 has an internal bore 157 for receiving the registration pin 142. The internal bore 157 extends from the top of the carrier 150 to a second smaller bore 158 at the bottom of the carrier which provides an upward facing annular internal ledge 160 at the bottom of the carrier. The registration pin 142 has a section 162 of smaller diameter at the bottom of the pin which creates an annular downward facing ledge 164. A helical spring 165 is disposed in the internal bore 157 between the annular downward facing ledge 164 and the annular upward facing internal ledge 160 at the bottom of the carrier 150. This spring 165 urges the registration pin 142 upward within the carrier.

To retain the pin 142 within the carrier 150, the pin is provided with a horizontal bore at the bottom of the larger diameter section of the pin in which is retained a cylindrical stopper pin 166. The stopper pin 166 is disposed in a vertical slot 168 in the back side of the carrier 150 as shown in FIG. 6. The spring 164 forces the registration pin 142 upward in the carrier and the travel of the pin 142 limited by the stopper pin 166 striking the upper end of the vertical slot 168. Thus. the normal position of the pin 142 is fully extended above the level of the tooling plate 12 with the stopper pin 166 against the top of the vertical slot 168.

The pin carrier 150 has a cutaway section 170 located below the horizontal section 152 and facing the lower reference surface 46. The cutaway section 170 allows surface the pin 142 to bear against the reference surface 48 when the pin is locked in position.

In operation, the straight edge member 44 is positioned precisely so that the reference surfaces 46 and 48 define the line of position for the registration pin 42/142. The clearances are such that when the pneumatic cylinder 70 is not applying force to the lever 66, the pin carrier 50/150, and thus the pin 42/142 is freely slidable in the longitudinal channel 64 between the channel and the longitudinal cam bar 56. The registration pin 42/142 is locked in position when the air cylinder 70 presses against the lever 66 which tends to rotate the longitudinal cam bar 56 against the facing surface of the carrier 50/150. The rotation of the cam bar 56 applies force to the cam-facing surface of the carrier 50/150 and pushes the registration pin 42/142 against the reference surfaces 46 and 48 to lock the registration pin in place both horizontally and vertically.

With the can bar 56 in the unlocked position, the registration pin 42/142 is easily moved along the line of position 32 by the spindle of the drilling machine and may be positioned anywhere along the line of position within the registration mechanism without prior knowledge of the present location of the registration pin. Using a spindle bit of sufficient toughness for pushing the registration pin 42/142, the drilling machine will start at one end (the first end) of the registration mechanism 40 at the height of the pin and proceed along the line of position toward the other end (the second end) of the mechanism until the spindle reaches the appropriate position. It is noted that the pin 42/142 may not have been in this area and thus may not have been moved as yet. The drilling machine then moves to the second end of the registration mechanism 40 and proceeds along the line of position at a height set to move the pin 42/142 toward the first end, stopping at the appropriate pin position. One of these procedures has pushed the pin 42/142 to the desired location and the pin is now positioned at the proper location on the line of position. The pneumatic cylinder 70 is now actuated to rotate the cam bar 56 to lock the registration pin 42/142 in place.

In the case of the height adjustable pins 142, the pin 142 is in place but it is extended to it maximum height above the tooling surface. After the pins 142 are positioned in the proper horizontal location as just described, the pins may be sequentially released (i.e. the cam bar is released) and the spindle used to push the pin down to the required height. While holding the pin at the correct height with the spindle, the pneumatic cylinder 70 is again actuated to lock the pin 142 in position at the desired horizontal location and at the desired height. A preferred method is to automatically load workpieces on the tooling plate 12 with the pins 142 fully extended. Thereafter, the apparatus will release a single pin 142, push it down to the desired height with the spindle, lock the pin in place and then proceed to position the next pin 142.

Figure 7:
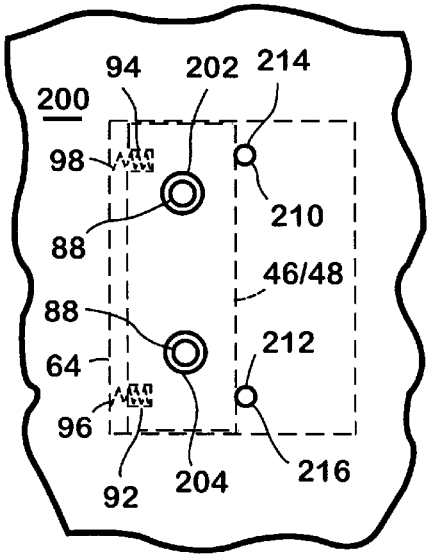
FIG. 7 is a top plan view illustrating the preferred system for the installing the straight edge member.

Turning now to the preferred procedure for aligning a straight edge member 44 and referring to FIG. 7, the straight edge member is placed in the longitudinal channel 64 in approximately the correct position. A calibration plate 200 is temporarily fixed by screws (not shown) on the surface of the tooling plate and covers the entire surface except for access holes 202 and 204 positioned over the counterbore holes 88 in the straight edge member 44. The drilling machine is then used to drill two holes 210 and 212 precisely located in the calibration plate 200 such that calibration pins 214 and 216 placed in the calibration holes will define the precise line of position for the straight edge member. The calibration pins 214 and 216 are then manually placed in the calibration holes 210 and 212 in the calibration plate 200 and extend into the longitudinal slot 64 of the tooling plate below the calibration plate. The reference surfaces 46 and 48 of a straight edge member 44 are forced against the calibration pins 214 and 216 by the helical springs 96 and 98 disposed in the bores 92 and 94 of the straight edged member against the back of the channel 64 in the tooling plate. The reference surfaces 46 and 48, which are at this time precisely positioned along the line of position, are then secured in place through the access holes 202 and 204 in the tooling plate 12 by securing the straight edge member 44 with screws in counterbore holes 88. Once the straight edge member 44 is precisely located the calibration plate may be removed and the removable parts of the registration mechanism may be installed.

Obviously many modifications and variations of the present invention are possible in light of the above teachings. It is therefore to be understood that within the scope of the appended claims, the invention may be practiced otherwise than as specifically described.

We claim:

1. Registration apparatus comprising:

a member having a reference surface;

a channel formed in said reference surface of said member;

a registration pin;

said registration pin movably mounted in said channel relative to said reference surface; and locking means for selectively causing said registration pin to bear against said member thereby locking said pin in a registration position relative to said member and said reference surface.

2. Registration apparatus as recited in claim 1 including:

carrier means in which said registration pin is disposed;

said carrier means is slidably disposed in said channel for selectively moving said registration pin relative to said member and said reference surface.

3. Registration apparatus as recited in claim 2 wherein, said locking means includes cam means disposed adjacent to said carrier means for selectively bearing against said carrier means to lock said registration pin in a registration position.

4. Registration apparatus as recited in claim 3 wherein said cam means includes a cam bar disposed adjacent to said carrier, and lever means for applying rotational force to said cam bar to couple said rotational force to said carrier means.

5. Registration apparatus as recited in claim 2 wherein said carrier means has an internal bore for retaining said registration pin in an upright position.

6. Registration apparatus as recited in claim 5 wherein said registration pin is movable in a vertical direction in said internal bore of the carrier means.

7. Registration apparatus as recited in claim 6 including:

bias means for biasing said registration pin upward in said vertical direction to a position of maximum height in said internal bore.

8. Registration apparatus as recited in claim 7 wherein, said bias means includes a spring disposed in said internal bore of said carrier to direct said registration pin upward, a stopper means disposed in said pin, and a slot in said carrier means for receiving said stopper means.

9. The registration apparatus recited in claim 2 wherein, said carrier means and said registration pin are individual components.

10. Registration apparatus as recited in claim 1 wherein said locking means includes;

force means for applying force to said registration pin thereby causing said registration pin to bear against said member.

11. Registration apparatus as recited in claim 10 wherein said force means for applying force to said registration pin includes a cam means disposed parallel to said reference surface, and lever means for applying rotational force to said cam means to couple said rotational force to said registration pin.

12. The registration apparatus recited in claim 10 wherein, said force means includes a pneumatic cylinder having a piston connected to said lever means thereby to apply force thereto.

13. Registration apparatus comprising, a work surface having a channel therein, a straight edge member disposed in said channel in said work surface, said straight edge member having a vertical surface for providing a straight reference surface;

a registration pin;

a carrier for retaining said registration pin upright;

said carrier and said registration pin movably disposed adjacent said vertical surface; and locking means for selectively locking said registration pin against said vertical surface in a registration position relative to said reference surface.

14. Registration apparatus as recited in claim 13 wherein, said straight edge member has a groove in said vertical surface, and a portion of said carrier is slidably disposed in said groove whereby said registration pin remains upright when said portion of said carrier is disposed in said groove.

15. Registration apparatus as recited in claim 14 wherein said means for locking includes cam means disposed adjacent said carrier in said channel in said work surface.

16. Registration apparatus as recited in claim 15 wherein, said cam means includes a cam bar disposed adjacent said carrier, and lever means for selectively applying force to said cam bar thereby to bear against said carrier.

17. Registration apparatus as recited in claim 13 wherein said carrier has a vertical bore for receiving said registration pin.

18. Registration apparatus as recited in claim 17 wherein said registration pin is movable in a vertical direction in said bore of said carrier.

19. Registration apparatus as recited in claim 18 including bias means for biasing said registration pin upward in said vertical direction.

20. Registration apparatus as recited in claim 19 wherein, said bias means comprises a spring disposed in said bore of the carrier.

21. Registration apparatus as recited in claim 18 wherein said locking means includes cam means disposed adjacent said carrier in said channel in said work surface.

22. Registration apparatus as recited in claim 21 wherein, said cam means includes a cam bar disposed adjacent to said carrier, and lever means for selectively applying force to said cam bar thereby to bear against said carrier.

23. The registration apparatus recited in claim 19 including, retainer means in said registration pin, and slot means in said carrier for receiving said retainer means to limit the upward biasing of said registration pin.

24. In a drilling machine of the type wherein a spindle and a horizontal work surface are relatively movable along three orthogonal axes, a method for positioning a registration pin on said work surface comprising:

disposing a straight edge member in a channel in said work surface to provide a straight vertical reference surface;

disposing said registration pin in a carrier in said channel for retaining said registration pin upright, said carrier being slidable along said reference surface to move said registration pin along said surface;

moving said registration pin to a registration position along said reference surface by pushing said registration pin along said reference surface with said spindle; and locking said registration pin in said registration position along said reference surface.

25. The method as recited in claim 24 wherein said step of disposing said registration pin in a carrier in said channel for retaining said registration pin upright comprises:

disposing said registration pin in a carrier having a bore for retaining said registration pin upright and movable in said bore in a vertical direction from a minimum position to a maximum extended position above said work surface;

biasing said registration pin to the maximum extended position; and wherein said step of moving said registration pin further includes moving said registration pin in a vertical direction from the maximum extended position to a registration position by pushing said registration pin in the vertical direction with said spindle.

*26. Registration apparatus comprising:*

*a. a member having a reference surface;*

*b. a plurality of channels relative to said reference surface;*

*c. a plurality of carriers slideably received by said channels;*

*d. a plurality of registration pins at least two of said pins each carried by an individual one of said plurality of carriers, the longitudinal axis of each registration pin being disposed generally in an upright position to said reference surface, and*

*e. a panel having a plurality of slots adapted for engaging at least two of said registration pins and selectively causing said registration pins to bear against said panel thereby locking said pin in a registration position relative to said member and said reference surface.*

*27. Registration apparatus as recited in claim 26 wherein each individual one of said carriers has an internal bore for retaining said registration pin in an upright position.*

*28. Registration apparatus as recited in claim 27 wherein each of said registration pins is moveable in a vertical direction in said internal bore of the individual one of said carriers carrying each of said registration pins.*

*29. Registration apparatus as recited in claim 28 including bias means for biasing said registration pin upward in said vertical direction to a position of maximum height in said internal bore.*

*30. Registration apparatus as recited in claim 29 wherein, said bias means includes a spring disposed in said internal*

*bore of said individual ones of said carriers to direct said registration pins upward:*

*a. a stopper means disposed in each of said pins, and*

*b. a slot in said individual ones of said carriers for receiving said stopper means.*

*31. The registration apparatus recited in claim 27 wherein said carriers and said registration pins are individual components.*

*32. Registration apparatus comprising,*

*a. a work surface having a channel therein,*

*b. a straight edge member moveably disposed in said channel in said work surface, said straight edge member having a vertical surface for proving a straight reference surface;*

*c. a registration pin; and*

*d. a carrier for retaining said registration pin upright; said carrier and said registration pin moveably disposed adjacent said vertical surface.*

*33. Registration apparatus comprising,*

*a. a work surface having a channel therein,*

*b. a straight edge member, disposed in said channel in said work surface, said straight edge member having a vertical surface for providing a straight reference surface, and said straight edge member having a groove in said vertical surface; a registration pin; and*

*c. a carrier for retaining said registration pin upright; said carrier and said registration pin moveably disposed adjacent said vertical surface; a portion of said carrier being slideably disposed in said groove whereby said registration pin remains upright when said portion of said carrier is disposed in said groove.*

*34. Registration apparatus comprising,*

*a. a work surface having a channel therein,*

*b. a straight edge member disposed in said channel in said work surface, said straight edge member having a vertical surface for providing a straight reference surface;*

*c. a registration pin; and*

*d. a carrier for retaining said registration pin upright; said carrier and said registration pin moveably disposed adjacent said vertical surface; said carrier has a vertical bore for receiving said registration pin said registration pin moveable in a vertical direction in said bore of said carrier.*

*35. Registration apparatus as recited in claim 34 including bias means for biasing said registration pin upward in said vertical direction.*

*36. Registration apparatus as recited in claim 35 wherein, said bias means rises a spring disposed in said bore of the carrier.*

*37. The Registration apparatus recited in claim 36 including,*

*a. retainer means in said registration pin, and*

*b. slot means in said carrier for receiving said retainer means to limit the upward biasing of said registration pin.*

*38. In a drilling machine of the type wherein a spindle and a horizontal work surface are relatively movable along three orthogonal axes, for drilling a workplace having registration slots, a method for positioning a registration pin on said work surface comprising:*

*a. disposing a straight edge member in a channel in said work surface to provide a straight vertical reference surface;*

*b. disposing said registration pin in a carrier in said channel for retaining said registration pin upright, said carrier being slidable along said reference to move said registration pin along said surface;*

*c. moving said registration pin to a registration position along said reference surface by pushing said registration pin along said reference surface with said spindle; and*

*d. locking said registration pin in said registration position along said reference surface by engaging said registration slots in said workplace.*

*39. The method as recited in claim 38 wherein said step of disposing said registration pin in a carrier in said channel for retaining said registration pin upright comprises:*

*a. disposing said registration pin in a carrier having a bore for retaining said registration pin upright and movable in said bore in a vertical direction from a minimum position to a maximum extended position above said work surface;*

*b. biasing said registration pin to the maximum extended position; and*

*wherein said step of moving said registration pin further includes moving said registration pin in a vertical direction from the maximum extended position to a registration position by pushing said registration pin in the vertical direction with said spindle until the top thereof is at or below the surface of the workplace.*

*40. Registration apparatus comprising:*

*a. a member having a reference surface;*

*b. a plurality of channels in said surface each having a separate adjustable straight edge member disposed therein;*

*c. a plurality of carriers slideably received by said channels;*

*d. a plurality of registration pins mounted on said carriers adapted for bias against said straight edge member;*

*e. a panel having at least two slots adapted for receiving at least two of said registration pins, said two registration pins being mounted on said carriers which are disposed at an angle greater than 0° with respect to each other.*

*41. A registration pin apparatus as described in claim 40 wherein said carriers are disposed transverse of one another.*

*42. A registration pin apparatus as described in claim 40 wherein said panel has at least three slots adapted for receiving at least three of said registration pins, said at least three registration pins being mounted on said carriers at least two of which are disposed at an angle greater than 0° to each other.*

*43. A registration pin apparatus as described in claim 42 wherein said at least two carriers are disposed transverse of each other.*

*44. Registration apparatus comprising,*

*a. a work surface having a channel therein,*

*b. a straight edge member disposed in said channel in said work surface, for providing a straight reference surface, said straight edge member having a vertical surface with a grove therein;*

*c. a registration pin; and*

*d. a carrier slideably disposed in said groove for retaining said registration pin upright; said carrier and said registration pin movably disposed adjacent said vertical surface.*

* * * * *